United States Patent
McLachlan et al.

(10) Patent No.: US 8,514,112 B2
(45) Date of Patent: Aug. 20, 2013

(54) PROGRAMMABLE LINEARITY CORRECTION CIRCUIT FOR DIGITAL-TO-ANALOG CONVERTER

(75) Inventors: Roderick McLachlan, Edinburgh (GB); Michael Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 60 days.

(21) Appl. No.: 13/168,017

(22) Filed: Jun. 24, 2011

(65) Prior Publication Data
US 2012/0013492 A1  Jan. 19, 2012

Related U.S. Application Data

(60) Provisional application No. 61/364,683, filed on Jul. 15, 2010.

(51) Int. Cl.
*H03M 1/06* (2006.01)
(52) U.S. Cl.
CPC .................. *H03M 1/0621* (2013.01)
USPC .................................... 341/118
(58) Field of Classification Search
USPC .................. 341/118, 119, 120, 144
See application file for complete search history.

(56) References Cited

U.S. PATENT DOCUMENTS

| | | | |
|---|---|---|---|
| 4,399,426 A * | 8/1983 | Tan | 341/120 |
| 4,835,535 A * | 5/1989 | Shibayama et al. | 341/120 |
| 4,999,633 A * | 3/1991 | Draxelmayr | 341/120 |
| 5,451,946 A * | 9/1995 | Smith et al. | 341/118 |
| 7,095,351 B2 | 8/2006 | Kirby et al. | |
| 2002/0126778 A1 | 9/2002 | Ojard et al. | |
| 2003/0160713 A1* | 8/2003 | Kuyel et al. | 341/120 |
| 2005/0163252 A1 | 7/2005 | McCallister et al. | |
| 2008/0133982 A1 | 6/2008 | Rawlins et al. | |

OTHER PUBLICATIONS

PCT International Search Report and Written Opinion for PCT/US11/41768 mailed on Oct. 27, 2011.
G.A.Miller et al., "A True 16b Self-Calibrating BiCMOS DAC," International Solid-State Circuits Conference, Feb. 1993, WP4.1.

* cited by examiner

*Primary Examiner* — Howard Williams
(74) *Attorney, Agent, or Firm* — Kenyon & Kenyon LLP

(57) ABSTRACT

The invention provides a systematic error correction network coupled to a converter. The converter may display a systematic non-linearity error, and the systematic error correction network shapes a correction transform function that acts like counter distortion function for the non-linearity error. The systematic error correction network then scales the correction transform function according to a reference variable, where the magnitude of non-linearity error is related to the reference variable. The scaled correction transform function is then applied to the converter path in order to generate a corrected analog output signal.

30 Claims, 10 Drawing Sheets

100

200

250

300

400

500

600

700

800

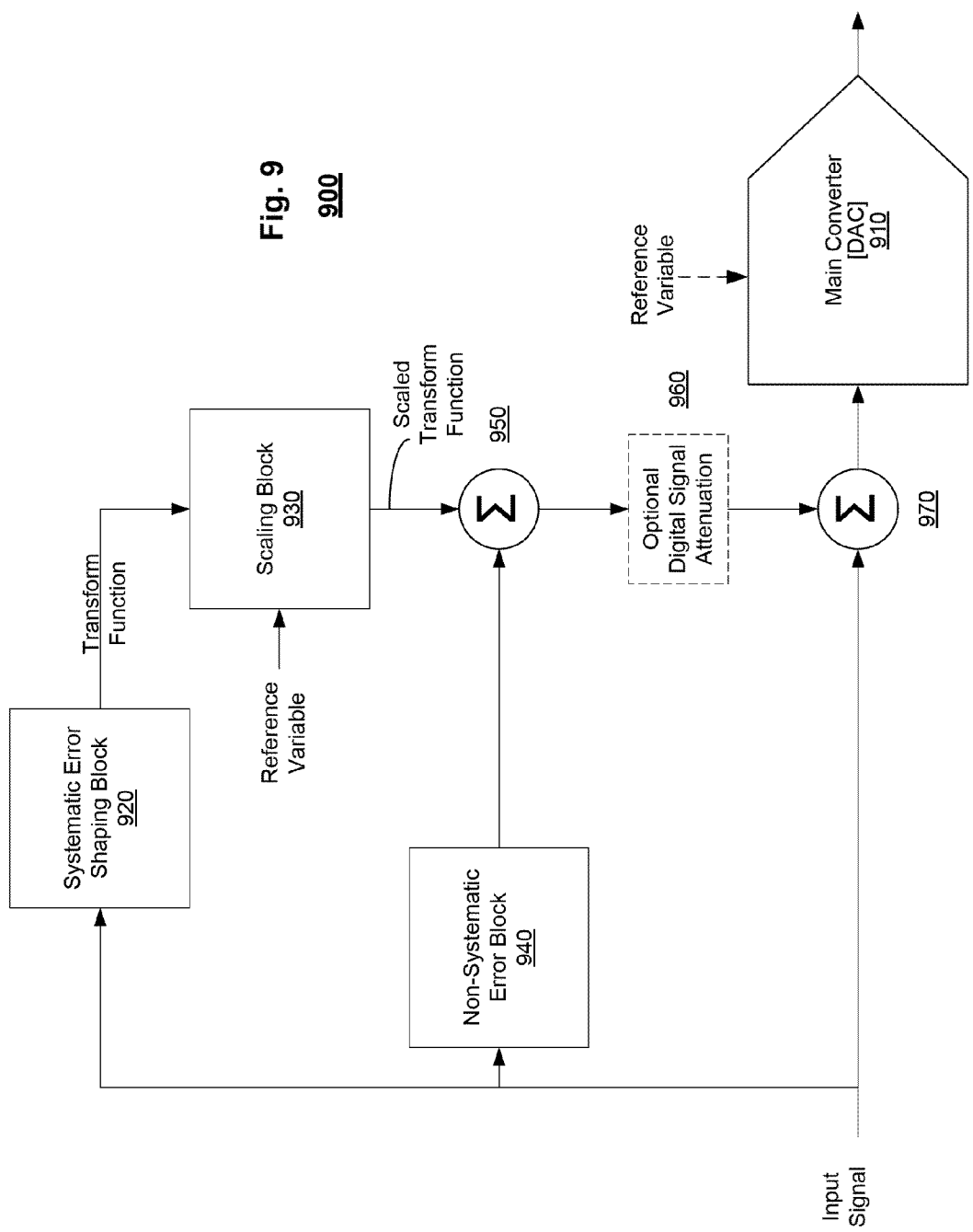

PROGRAMMABLE LINEARITY CORRECTION CIRCUIT FOR DIGITAL-TO-ANALOG CONVERTER

RELATED APPLICATION

This application claims benefit of priority from U.S. provisional application "Programmable Linearity Correction Circuit for Digital-to-Analog Converter," Ser. No. 61/364,683, filed Jul. 15, 2010. The disclosure of which is incorporated herein by reference in its entirety.

BACKGROUND

The present invention relates to correcting systematic errors in digital-to-analog converters (DACs). DAC designers desire to make accurate linear converters such that the output analog voltage is a linear function of the digital input code. However, DAC components often introduce errors into the DAC, which add non-linear errors to the linear transform function leading to inaccurate DACs.

The errors can be divided into two groups: Non-systematic and systematic errors. Non-systematic errors are random, unpredictable errors that are insensitive to other characteristics of the converter. Non-systematic errors are often introduced in the manufacturing process. For example, device mismatch may arise randomly among different manufacturing lots of a common integrated circuit. Since these errors are insensitive to other parts, the errors, generally, can be defined in classes.

Systematic errors, on the other hand, are predictable and are the result from specific DAC components. Systematic errors also vary according to some variable (e.g. voltage, temperature). For example, some integrated DACs include SiCr thin-film resistors (TFRs). Even though TFRs provide better linearity than polysilicon or diffusion resistors, TFRs still introduce non-linearity errors into the DAC transfer function because TFRs, generally, dissipate power and heat over themselves. The power and heat dissipation alter the resistance of TFR when the temperature coefficient of resistance is non-zero leading to the largest source of non-linearity error in a TFR. Consequently, a DAC including TFRs may show non-linear behavior due to the non-linearity of the TFR.

The non-linearity behavior depends on the DAC operating voltage. Therefore, larger operating voltages correspond to greater non-linearity errors because larger operating voltages dissipate more power and heat in its constituent TFR. With respect to an ideal linear two-terminal resistor, Ohm's Law states that the voltage and current are linearly related as:

$$V = I * R,$$

where V is voltage, I is the current, and R is the resistance, which is a constant. However, in real world conditions two terminal resistors are subject to self-heating effects that leads to non-linearity effects. Due to the non-linearity effects, the resistance R varies according to the power in the resistor as:

$$R(V) = R_o \{1 + KV^2\},$$

where $R_o$ is the ideal linear resistance value and K is a heating coefficient that is a constant. Since K is typically a small number, the non-linear term of the equation is smaller than the linear term.

Accordingly, the relationship between the voltage and current transforms to:

$$V = I * R(V) = I * R_o \{1 + KV^2\}$$

As seen by the above equation, the non-linearity errors introduced by the heating effects are dependant on the voltage. Thus, heating effects on the resistors can be categorized as systematic errors. Other converter components, such as capacitors, can also lead to systematic errors.

There is a need in the art for an error correction network that creates specific counter distortion in response to the identified systematic non-linearity errors.

BRIEF DESCRIPTION OF THE DRAWINGS

FIG. 9 is a simplified block diagram of a digital to analog converter according to an embodiment of the present invention.

DETAILED DESCRIPTION

Embodiments of the present invention may provide a system including a digital to analog converter to convert a digital input signal into an analog signal. The system also includes an error correction network to sample the digital input signal and to generate a correction signal based on a systematic non-linearity characteristic of the digital to analog converter, and to scale the correction signal by a reference variable. Furthermore, the system includes an output to merge the analog signal with the correction signal generated by the error correction network.

Embodiments of the present invention also may provide a method to correct for non-linearity errors in a digital to analog conversion of a digital input signal to an analog output signal. The method includes to sample the digital input signal; generate an anti-distortion signal based on the sampled signal, wherein the anti-distortion signal includes a correction signal according a reference variable, wherein the reference variable is related to the systematic error; apply the anti-distortion signal to the conversion; and generate the analog output signal.

Figure 1:
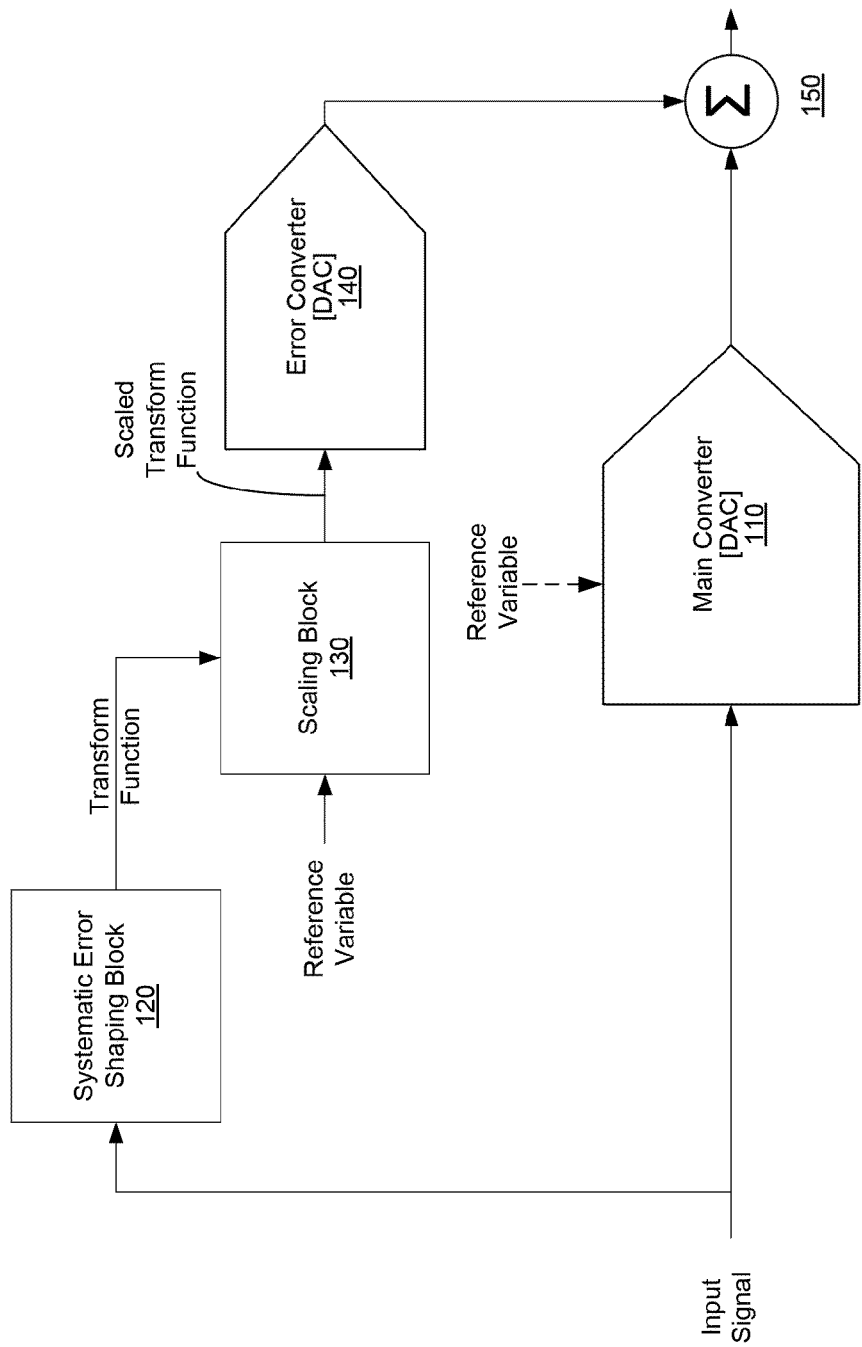
FIG. 1 is a simplified block diagram of a digital to analog converter according to an embodiment of the present invention.

FIG. 1 is a block diagram of a converter 100 with a systematic error correction network according to an embodiment of the present invention. The converter 100 may include a main converter 110, a systematic error shaping block 120, a scaling block 130, an error converter 140, and a summer 150.

The main converter 110 may be any type of a digital-to-analog converter that exhibits non-ideal behavior such as non-linearity effects. For example, it may be a voltage mode resistor-divider DAC, a binary weighted R2R DAC, a current mode DAC, a binary weighted capacitor array DAC or any other suitable DAC. The main converter 110 may receive a digital input digital signal and may convert it to an analog signal.

The systematic error shaping block 120 may receive the input signal and produce a correction transform function. The systematic error shaping block 120 may be a look up table (LUT), an arithmetic processor or other suitable device.

The scaling block 130 may be coupled to the systematic error shaping block 120 that generates a scaled correction transform function. The scaling block 130 may be implemented as a digital amplifier, digital attenuator, or any suitable device that provides a digital gain or attenuation. The scaling block 130 may also receive a reference variable input that controls the magnitude of the scaling function. In an embodiment, the systematic error shaping block 120 and the scaling block 130 may be integrated together.

The error converter 140 may be coupled to the scaling block 130. The error converter 140 may be the same type of converter as the main converter 110 but to a smaller scale. The error converter 140 may convert the digital scaled correction transform function into an analog signal. The summer 150 may be coupled to the error converter 140 and the main converter 110 to combine the outputs of the two converters.

The converter 100 may operate in the following manner. A digital input signal may be received at an input of the main converter 110. The main converter 110 may convert the digital input signal into an output analog signal. Due to systematic errors within the main converter 110, the output voltage may deviate from an ideal value by an error value.

The digital input signal may also be sampled by the systematic error shaping block 120. The systematic error shaping block 120 may sample only some upper bits (MSBs) of the digital input signal. The systematic error shaping block 120 may then generate a correction transform function according to a specific characteristic of the digital input signal. For example, systematic error shaping block may use a look up table (LUT) of systematic non-linearities stored for different digital signals. The LUTs may contain specific transform functions for various digital signal profiles. The correction transform function may be an inverse function of its corresponding systematic error function.

The scaling block 130 may receive the correction transform function and may apply a scaling factor according to the reference variable input into the scaling block 130. The reference variable may be related to the systematic non-linearity such that that the systematic non-linearity may depend on the reference variable magnitude. Further, the reference variable may also be an input into the main converter 110 such as a driving voltage. For example in a voltage mode resister-divider DAC, the systematic non-linearity characteristic of non-linear resistance may depend on the reference voltage across the resistor. The scaling block 130 may then generate a scaled digital correction transform function that, when applied to the DAC output, may cause corrective gain or attenuation of the output. The scaling block 130 may use a linear function or may use a non-linear function in order to correct for a family of non-linearity curves. The reference variable may be stored in a digital register that is under manual or automatic control.

The error converter 140 may convert the scaled correction transform function generating an analog correction signal. The correction signal may then be combined with the output analog signal outputted by the main converter 110 by the summer 150.

Hence, the correction signal may provide a counter distortion in response to the identified systematic non-linearity errors in the converter 100. The counter distortion may destructively interfere with the non-linearity error and, thus, cancel the non-linearity error. Therefore, the systematic error correction network of the present invention may provide more accurate digital to analog conversion results as compared to prior art converters.

Figure 2A:
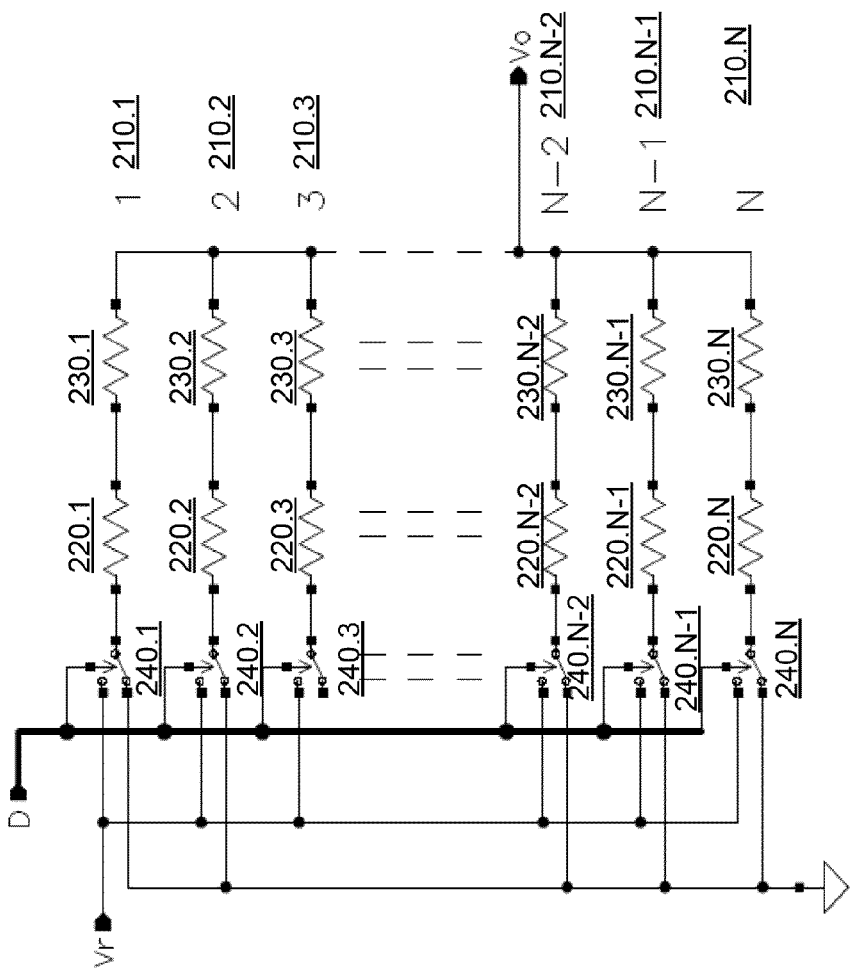
FIGS. 2(a) and 2(b) are circuit diagrams of digital to analog converters according to embodiments of the present invention.
Figure 2B:
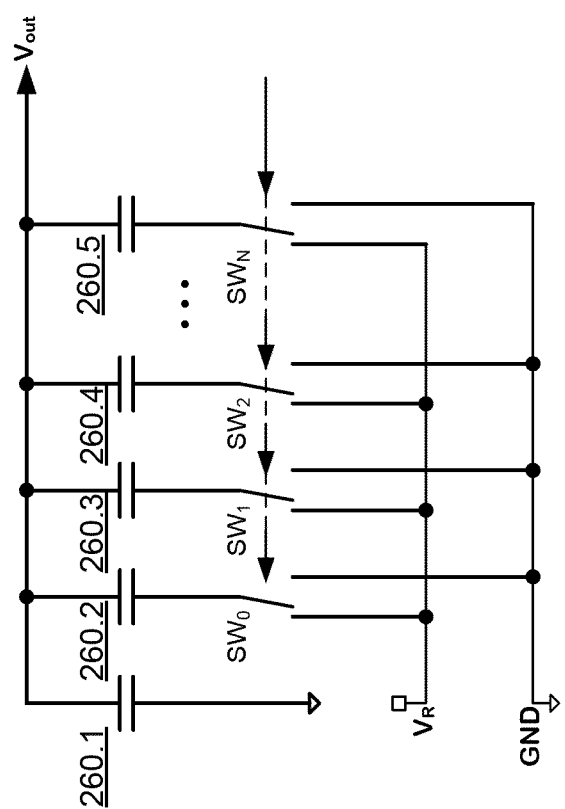

The above-mentioned operation will now be described using a specific DAC example. FIG. 2(*a*) is a circuit diagram of voltage mode resistor-divider DAC core 200 according to an embodiment of the present invention, and FIG. 2(*b*) is a circuit diagram of a capacitor array DAC core 250 according to an embodiment of the present invention.

The DAC core 200 in FIG. 2(*a*) may include a plurality of segments 210.1-210.*n*. Each segment may include a pair of resistors 220.1-*n*, 230.1-*n* and a switch 230.1-*n*. The resistors 220.1-*n*, 230.1-*n* may be TFRs. The switch 230.1-*n* may either connect each segment either to GND or an applied reference voltage Vr. A control input code D may control the states of the switches 230.1-*n* individually. D may be a number between zero to one that is a fraction of segments switched to Vr rather than GND. The combination of the outputs of the segments may define the output voltage Vo.

The current that flows in the resistors 220.1-*n*, 230.1-*n* of each segment 210.1-*n* may depend on the control input code D and Vo. For example, if all switches are connected to GND, then no current will flow through any resistors. Similarly, if all switches are connected to Vr, then also no current will flow through any resistors. Furthermore, if half the segments are switched to GND and the other half are switched to Vr, then Vo=Vr/2 because all resistors will carry an equal amount of current, even if they are non-linear.

However, non-linearities may be introduced when segment resistors carry different currents from each other. For example, if ¼ of the segments are switched to Vr, and the remaining ¾ segments are switched to GND, then Vo should ideally be Vr/4. Since each resistor connected to Vr will carry three times more current than each resistor switched to GND, non-linearity errors may be introduced into the system because of the current imbalance. The resistance non-linearity may cause a systematic mismatch between resistors switched high or low causing the actual output voltage Vo to deviate from the ideal Vr/4.

Figure 3:
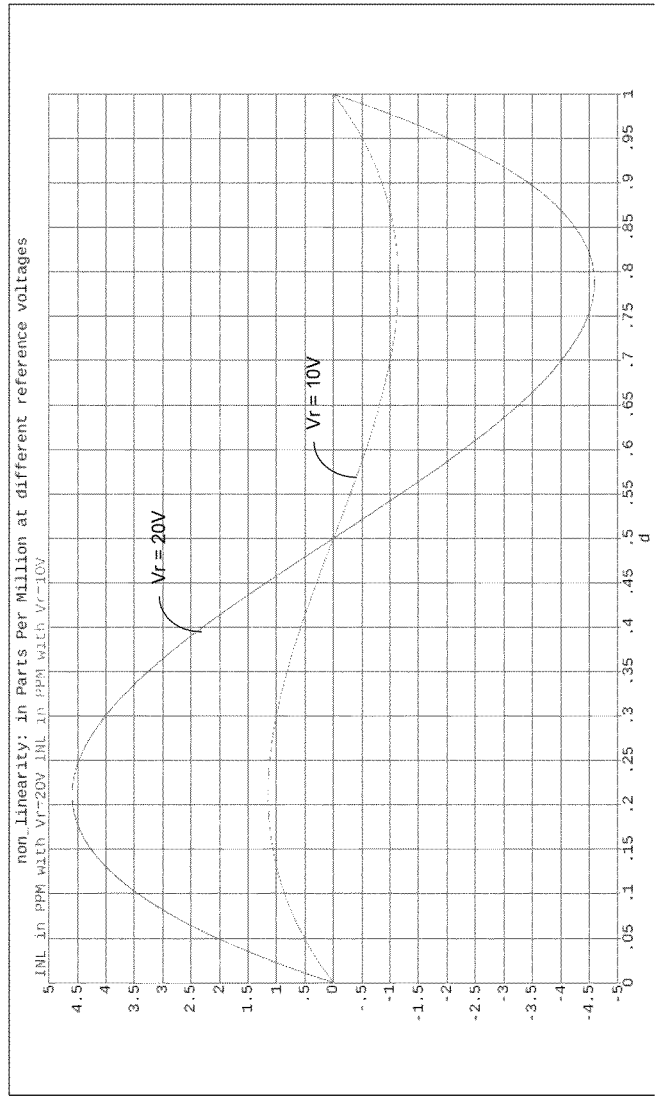
FIG. 3 illustrates a graph of non-linearity error functions according to an embodiment of the present invention.

FIG. 3 illustrates a graph 300 of non-linearity errors as a function of D obtained from simulation. The non-linearity errors are expressed as a fraction of full-scale in parts-per-million (PPM) of full scale. The graph 300 illustrates the non-linearity function at two different driving voltages applied to the digital-to-analog converter. Both non-linearity curves, 20V and 10V, have the same shape/profile but have different magnitudes. In a voltage mode DAC, the shape of the non-linearity curve is, generally, a bipolar polynomial shape. As graph 300 illustrates, the magnitude of the non-linearity errors may be related directly to the reference voltage.

Also, graph 300 illustrates that there are no non-linearity errors when D is 0, 0.5, or 1 as expected from the above discussion. When D equals zero, all switches are connected to GND and no current, consequently, may flow through any of the resistors. Thus, non-linearity errors will also not be present. When D equals 1, all switches are connected to Vr and no current, consequently, may flow through any of the resistors again. Thus, non-linearity errors will also not be present. When D equals 0.5, half the segments are switched to GND and the other half are switched to Vr. Therefore, all resistors will carry an equal amount of current and will have the same DC resistance and, thus, non-linearity errors will also not be present.

Figure 4:
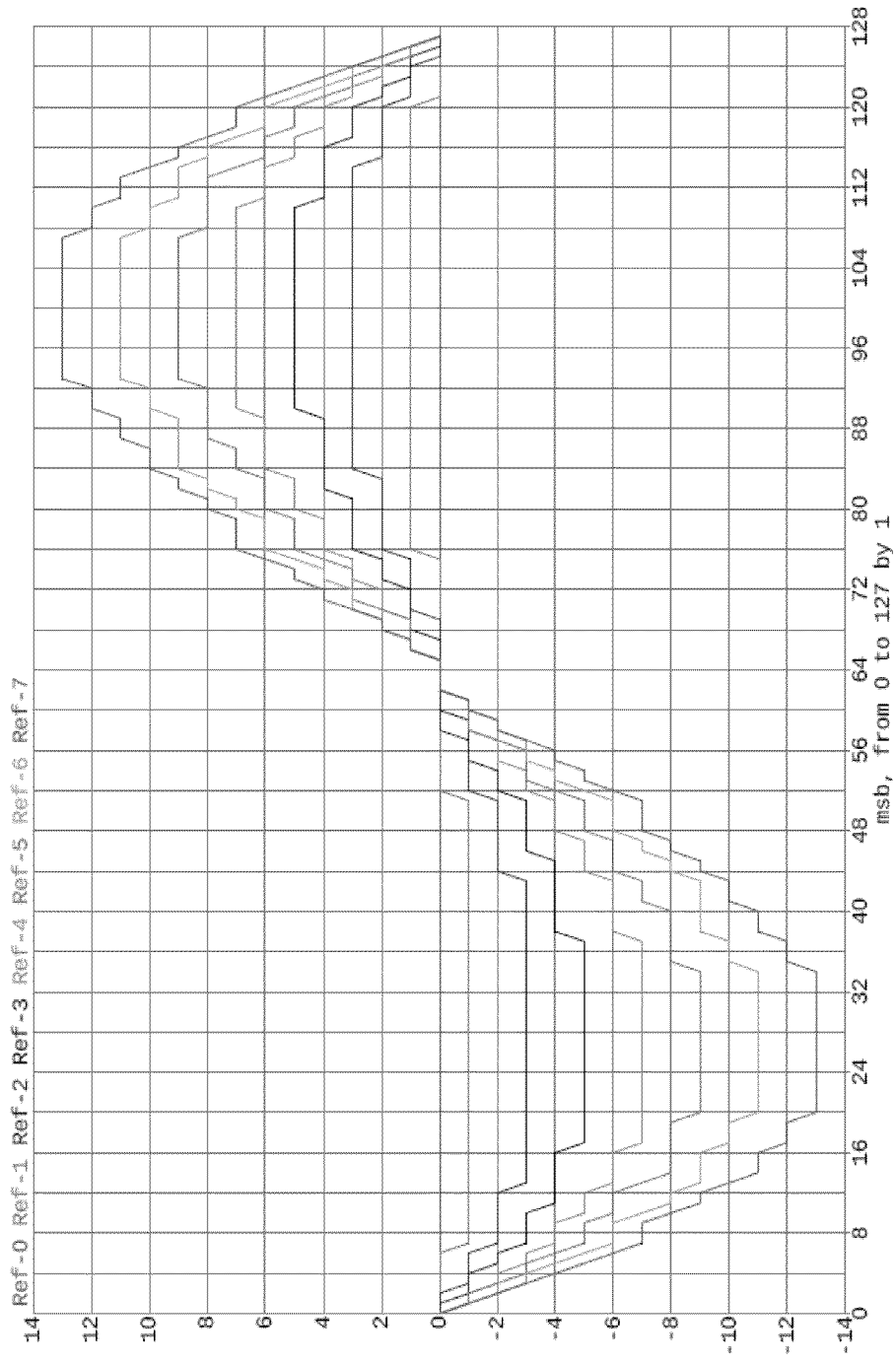
FIG. 4 illustrates a graph of scaled correction transform functions according to an embodiment of the present invention.

According to an embodiment of the present invention, the converter 100 with systematic error correction network of FIG. 1 may correct the systematic non-linearity errors as illustrated in graph 300 of FIG. 3. The systematic error shaping block 120 may sample the digital input signal. In an embodiment, the systematic error shaping block 120 may only sample a portion of the digital input signal, such as the upper bits (i.e. MSBs). Based on the sampled digital input signal, the shaping block 120 may generate a correction transform function that will be the inverse of the non-linearity function of graph 300. The correction transform function may be selected from a stored table based on the sampled digital input signal. The table may be pre-stored with various digital signals and corresponding correction transform functions. The scaling block 130 may then apply a gain or attenuation to the correction transform function according to a reference variable. In this example, the reference variable is the reference voltage. Consequently, the scaling block 130 produces a scaled correction transform function that is related to the reference variable. FIG. 4 illustrates graph 400 of a group of scaled correction transform functions that may be produced by the shaping block 120 and scaling block 130. Graph 400 illustrates a group of digital outputs based on the 7 upper bits (MSBs) of the DAC input code.

Graph 400 illustrates that the scaled correction transform functions are inverses (equal and opposite) of the non-linearity function of graph 300 where the shape is constant and the size of the function depends the reference voltage. The scaled correction transform function may then be converted into an analog correction signal. The analog correction signal may then be combined with the analog output signal to produce a corrected analog output signal that should be relatively free of non-linearity errors. As shown, the systematic error correction network generates an anti-distortion signal that counters the systematic non-linearity errors thus resulting in a more accurate conversion.

Figure 5:
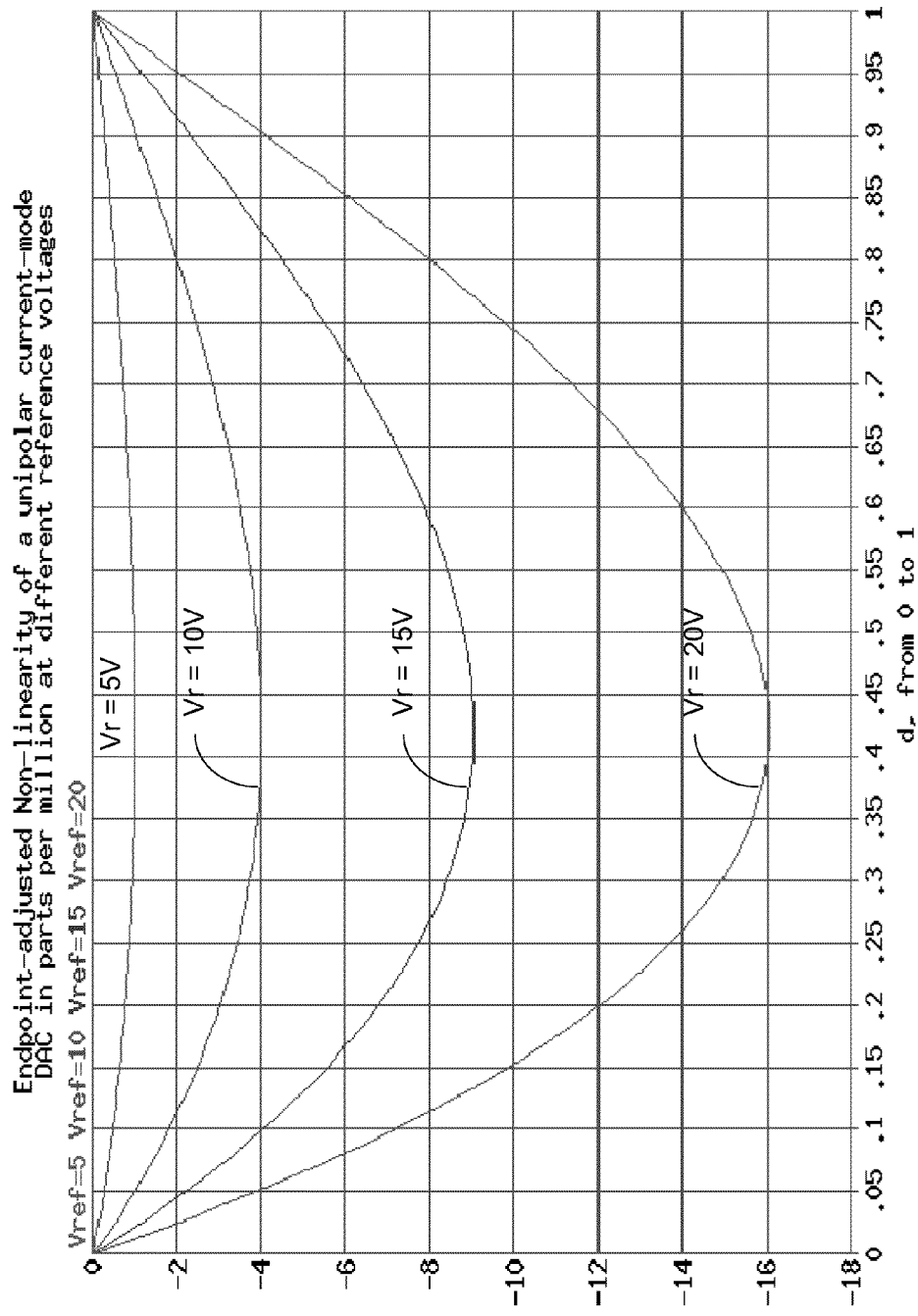
FIG. 5 illustrates a graph of non-linearity error functions according to an embodiment of the present invention.

The above example illustrates error profiles and corrections applied to a voltage mode DAC; however, the present invention may find application in a variety of different DAC architectures. For example, the present invention may be implemented using a current-mode DAC. The operation of the present invention will be similar to the above operation, but the current-mode DAC may produce a unipolar non-linearity error curve as shown in graph 500 in FIG. 5.

The non-linearity error curves of graph 500 are also a function of D. The non-linearity errors are expressed as a fraction of full-scale in parts-per-million (PPM) of full scale. The graph 500 illustrates the non-linearity function at four different driving voltages, 20V, 15V, 10V, and 5V.

All non-linearity functions in graph 500 have the same shape/profile. In a current mode DAC, the shape of the non-linearity function is, generally, a unipolar shape. As graph 500 illustrates, the magnitude of the non-linearity errors may be directly related to the reference voltage. Also, graph 500 illustrates that there are no non-linearity errors when D is 0 or 1.

Figure 6:
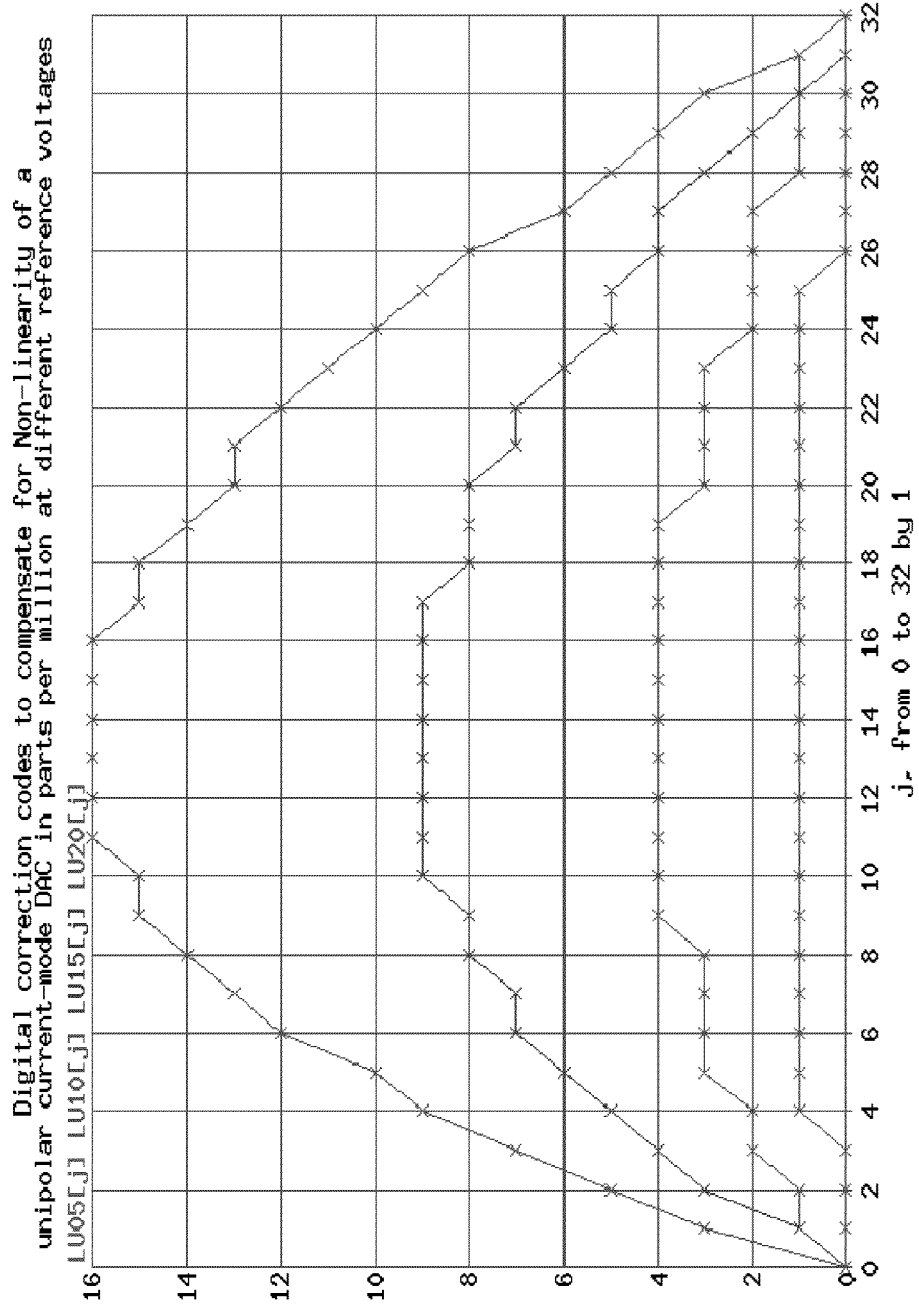
FIG. 6 illustrates a graph of scaled correction transform functions according to an embodiment of the present invention.

Accordingly, the correction transform function for a current mode DAC may be the inverses of the unipolar functions in graph 500. Graph 600 of FIG. 6 illustrates the scaled correction transform functions. Graph 600 illustrates a group of digital outputs based on the 5 upper bits (MSBs) of the DAC input code. Graph 600 also illurstrates that the scaled correction transform functions are inverses (equal and opposite) of the non-linearity functions of graph 500 where the shape is constant and the size of the function depends the reference voltage. The scaled correction transform function may then be converted into an analog correction signal. The analog correction signal may then be combined with the analog output signal to produce a corrected analog output signal that should be relatively free of non-linearity errors. As shown, the systematic error correction network generates an anti-distortion signal that counters the systematic non-linearity errors thus resulting in a more accurate conversion.

The above embodiments were described using the reference voltage as the reference variable; however, the present invention may use other reference variables that affect systematic non-linearities. For example, the present invention may use temperature as the reference variable. Therefore, the correction transform functions may vary according to temperature and be scaled according to a reference temperature.

Referring back to FIG. 2(b), the DAC core 250 may be a capacitor array DAC. The DAC core 250 may include a plurality of capacitors 260.1-260.$n$ that are coupled to a plurality of switches $SW_0$-$SW_N$. The operation of the plurality of capacitors 260.1-260.$n$ may be controlled by the coupled switches $SW_0$-$SW_N$. For example, the plurality of capacitors 260.1-260.$n$ may be a binary weighted capacitor array. The capacitor array DAC, however, may also suffer from non-linearity errors because the capacitors in the array may display non-linear characteristics. The non-linearity errors may be related to the voltage across the capacitors. Accordingly, the non-linearity errors in the capacitor array DAC may be correctable by the embodiments of the present invention described herein.

In an embodiment of the present invention, the systematic error correction network may be implemented primarily using digital circuitry. A digital implementation may reduce the analog circuitry components and, consequently, may reduce the systematic error correction network size. Also, a primarily digital implementation may be reconfigurable and programmable.

Figure 7:
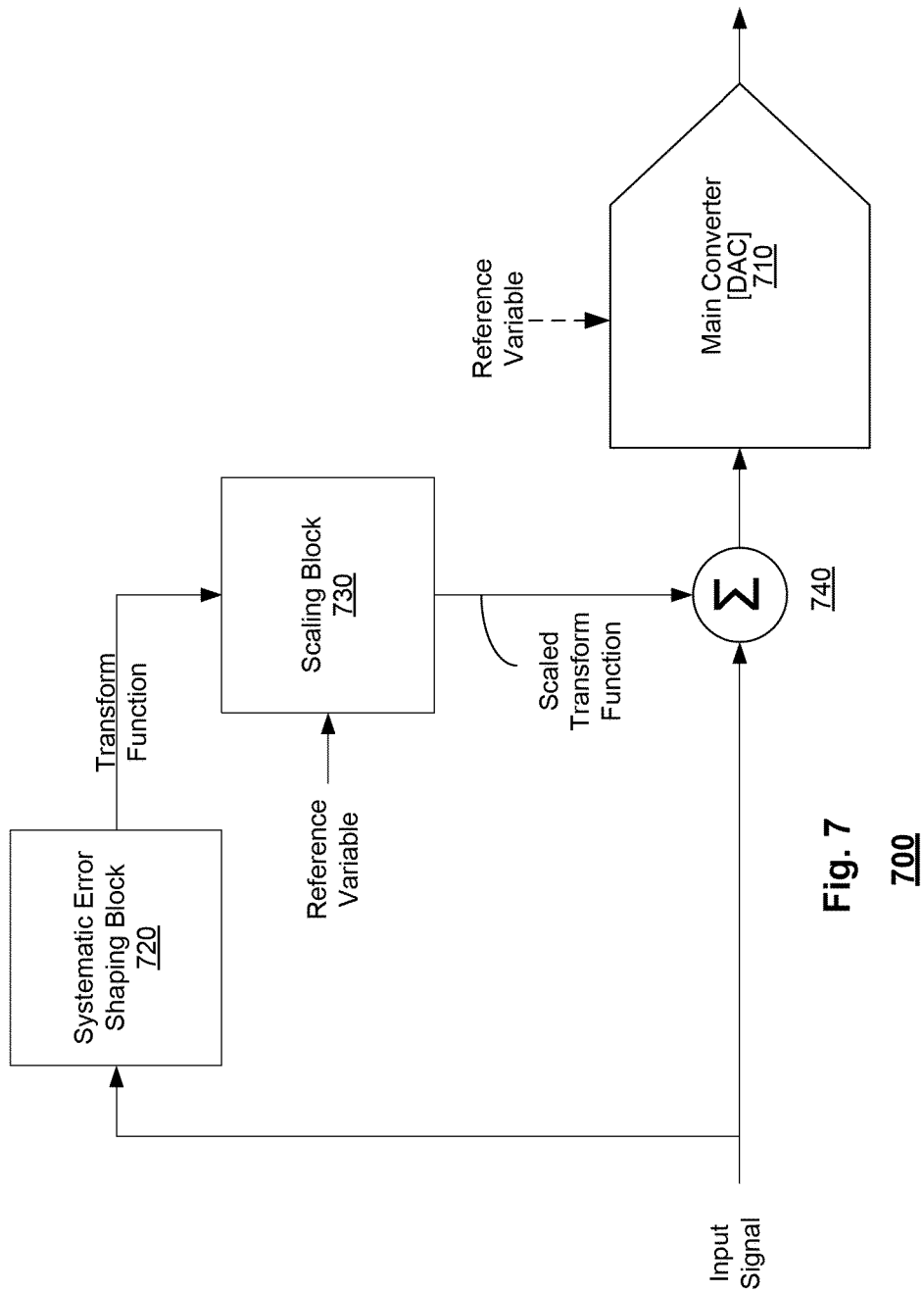
FIG. 7 is a simplified block diagram of a digital to analog converter according to an embodiment of the present invention.

FIG. 7 is a block diagram of a converter 700 with an all digital systematic correction network according to an embodiment of the present invention. The converter 700 may include a main converter 710, a systematic error shaping block 720, a scaling block 730, and a digital summer 740.

The main converter 710 may be any type of a digital-to-analog converter that exhibits non-ideal behavior such as non-linearity effects. For example, it may be a voltage mode resistor-divider DAC, a binary weighted R2R DAC, a current mode DAC, a binary weighted capacitor array DAC, or any other suitable DAC.

The systematic error shaping block 720 may receive the input signal and produce a correction transform function. The systematic error shaping block 720 may be a look up table (LUT), an arithmetic processor, or other suitable device.

A scaling block 730 may be coupled to the systematic error shaping block 720 that generates a scaled correction transform function. The scaling block 730 may be implemented as a digital amplifier, digital attenuator, or any suitable device that provides a digital gain or attenuation. The scaling block 730 may also receive a reference variable input that controls the magnitude of the scaling function. In an embodiment, the systematic error shaping block 720 and the scaling block 730 may be integrated together.

The digital summer 740 may combine the digital input signal and the scaled correction transform function. The main converter 710 may receive the combined signal at an input. The main converter 710 may convert the combined signal into an analog signal and output the analog signal.

The operation of the systematic error shaping block 720 and scaling block 730 is substantially similar as to other embodiments described herein. Therefore, their operational description will not be repeated here.

Figure 8:
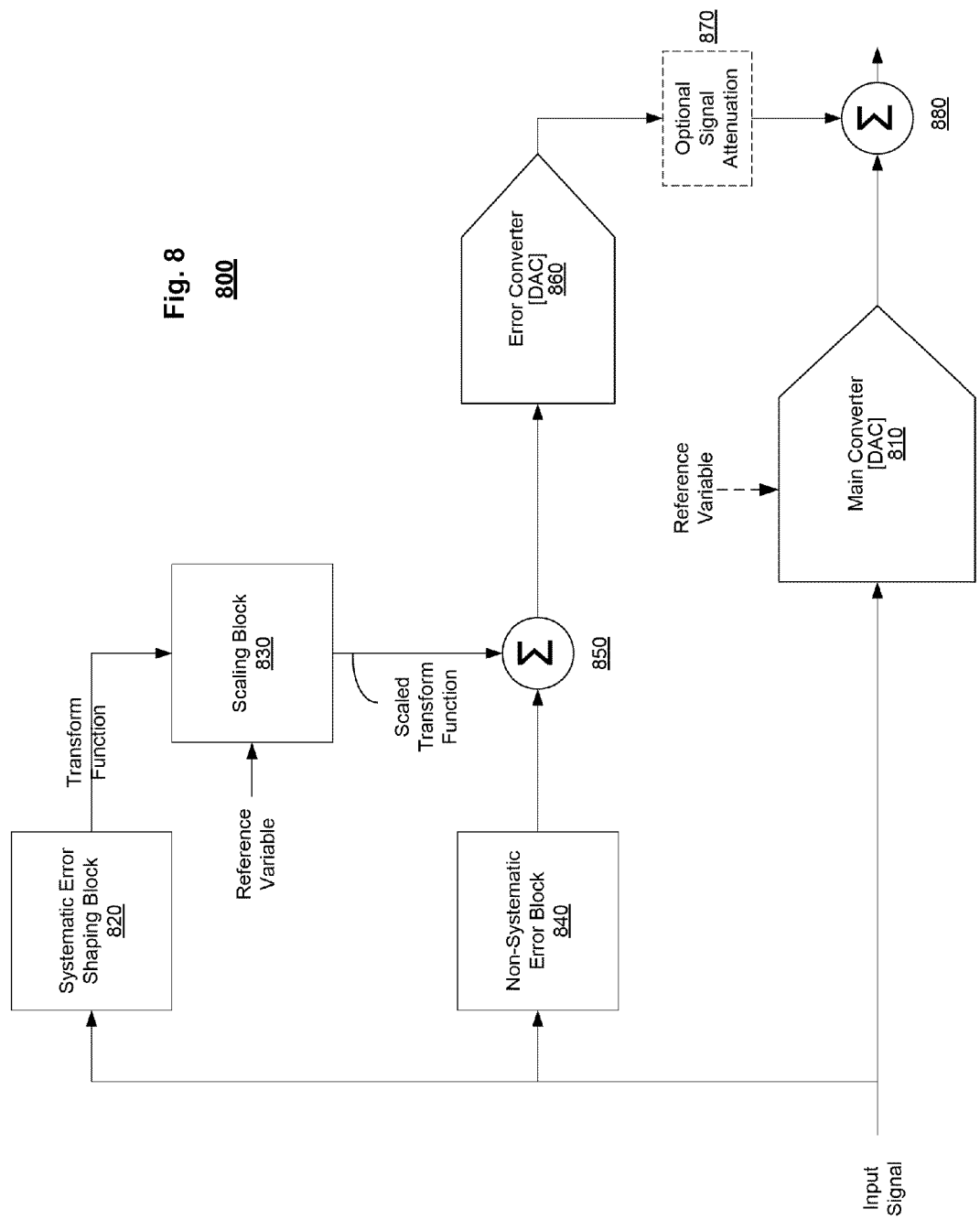
FIG. 8 is a simplified block diagram of a digital to analog converter according to an embodiment of the present invention.

In another embodiment of the present invention, non-systematic errors may be accounted for in addition to systematic errors. FIG. 8 is a block diagram of a converter 800 with two correction paths according to an embodiment of the present invention. The first path may correct systematic errors, and the second path may correct non-systematic errors.

The converter 800 may include a main converter 810, a systematic error shaping block 820, a scaling block 830, a non-systematic error block 840, a digital summer 850, an error converter 860, an optional attenuator 870, and a summer 880.

The main converter 810 may be any type of a digital-to-analog converter that exhibits non-ideal behavior such as non-linearity effects. For example, it may be a voltage mode resistor-divider DAC, a binary weighted R2R DAC, a current mode DAC, a binary weighted capacitor array DAC, or any other suitable DAC. The main converter 810 may receive a digital input digital signal and may convert it to an analog signal.

The first path for systematic error correction may include the systematic error shaping block 820 and the scaling block 830. The systematic error shaping block 820 may receive the input signal and produce a correction transform function. The systematic error shaping block 820 may be a look up table (LUT), an arithmetic processor, or other suitable device.

The scaling block 830 may be coupled to the systematic error shaping block 820 that generates a scaled correction transform function. The scaling block 830 may be implemented as a digital amplifier, digital attenuator, or any suitable device that provides a digital gain or attenuation. The scaling block 830 may also receive a reference variable input that controls the magnitude of the scaling function. In an embodiment, the systematic error shaping block 820 and the scaling block 830 may be integrated together.

The operation of the systematic error shaping block 820 and scaling block 830 is substantially similar as to other embodiments described herein. Therefore, their operational description will not be repeated here.

The second path for non-systematic error correction may include the non-systematic error block 840. The non-systematic error block 840 may also receive the digital input signal. The non-systematic error block 840 may be implemented as or may include a calibration LUT, an arithmetic processor, or other suitable devices. The non-systematic error block may only sample the upper bits (i.e. MSBs) of the digital input signal. The non-systematic error block 840 may operate as a calibration block to calibrate for errors caused by the manufacturing process (i.e. non-systematic errors). The non-systematic error block 840 may also generate a non-systematic correction function accordingly.

The digital summer 850 may combine the scaled systematic correction transform function and non-systematic correction function. The combined correction functions may then be inputted into the error converter 860. The error converter 860 may be the same type of converter as the main converter 810 but to a smaller scale. The error converter 140 may convert the digital combined correction functions into an analog signal. The summer 150 may be coupled to the error converter 860 and the main converter 810 to combine the outputs of the two converters.

Hence, the correction signal may provide a counter distortion in response to the identified systematic non-linearity errors in the converter 100 as well as a correctional adjustment for the non-systematic errors present in the converter 100. The counter distortion may destructively interfere with the non-linearity error and, thus, cancel the non-linearity error. Therefore, the systematic error correction network of the present invention may provide more accurate digital to analog conversion results as compared to prior art converters.

In an embodiment of the present invention, a two path error correction network for systematic and non-systematic errors may be implemented primarily using digital circuitry. A digital implementation may reduce the analog circuitry components and, consequently, may reduce the error correction network size. Also, a primarily digital implementation may be reconfigurable and programmable.

FIG. 9 is a block diagram of a converter 900 with an all digital systematic correction network according to an embodiment of the present invention. The converter 900 may include a main converter 910, a systematic error shaping block 920, a scaling block 930, a non-systematic error block 940, a first digital summer 940, an optional attenuator 960, and a second digital summer 970.

The main converter 910 may be any type of a digital-to-analog converter that exhibits non-ideal behavior such as non-linearity effects. For example, it may be a voltage mode resistor-divider DAC, a binary weighted R2R DAC, a current mode DAC, a binary weighted capacitor array DAC, or any other suitable DAC.

The first path for systematic error correction may include the systematic error shaping block 920 and the scaling block 930. The systematic error shaping block 920 may receive the input signal and produce a correction transform function. The systematic error shaping block 920 may be a look up table (LUT), an arithmetic processor, or other suitable device.

A scaling block 930 may be coupled to the systematic error shaping block 920 that generates a scaled correction transform function. The scaling block 930 may be implemented as a digital amplifier, digital attenuator, or any suitable device that provides a digital gain or attenuation. The scaling block 930 may also receive a reference variable input that controls the magnitude of the scaling function. In an embodiment, the systematic error shaping block 920 and the scaling block 930 may be integrated together.

The operation of the systematic error shaping block 920 and scaling block 930 is substantially similar as to other embodiments described herein. Therefore, their operational description will not be repeated here.

The second path for non-systematic error correction may include the non-systematic error block 940. A non-systematic error block 940 may also receive the digital input signal. The non-systematic error block 940 may be implemented as or may include a calibration LUT, an arithmetic processor, or other suitable devices. The non-systematic error block may only sample the upper bits (i.e. MSBs) of the digital input signal. The non-systematic error block 940 may operate as a calibration block to calibrate for errors caused by the manufacturing process (i.e. non-systematic errors). The non-systematic error block 940 may generate a non-systematic correction function accordingly.

The first digital summer 950 may combine the scaled systematic correction transform function and non-systematic correction function. The combined correction functions may then be digitally attenuated by attenuator 960 if needed. The second digital summer 970 may combine the digital input signal and the combined correction functions. The main converter 910 may receive the second combined signal at an input. The main converter 910 may convert the second combined signal into an analog signal and output the analog signal.

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be implemented, for example, using a computer-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disc Read Only Memory (CD-ROM), Compact Disc Recordable (CD-R), Compact Disc Rewriteable (CD-RW), optical disk, magnetic media, magneto-optical media, removable memory cards or disks, various types of Digital Versatile Disc (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

We claim:

1. A system, comprising:
   a digital to analog converter to convert a digital input signal into an analog signal;
   an error correction network to sample the digital input signal, to generate a correction signal based on a systematic non-linearity characteristic of the digital to analog converter, to receive a reference variable input that is related to and varies in accordance with the systematic non-linearity characteristic, and to scale the correction signal by the reference variable; and
   an output to merge the analog signal with the correction signal generated by the error correction network.

2. The system of claim 1, wherein the correction signal is a bipolar polynomial transform function.

3. The system of claim 1, wherein the correction signal is an unipolar transform function.

4. The system of claim 1, wherein the error correction network comprises a look up table (LUT).

5. The system of claim 1, wherein the error correction network comprises an arithmetic processor.

6. The system of claim 1, wherein the error correction network comprises a digital amplifier to scale the correction signal.

7. The system of claim 1, wherein the error correction network comprises a digital attenuator to scale the correction signal.

8. The system of claim 1, wherein the error correction network comprises an error digital to analog converter.

9. The system of claim 1, wherein the digital to analog converter is a voltage mode resistor-divider converter.

10. The system of claim 1, wherein the systematic non-linearity characteristic is non-linear resistance.

11. The system of claim 10, wherein the reference variable is a voltage across the non-linear resistance.

12. The system of claim 1, wherein the digital to analog converter is a capacitor array converter.

13. The system of claim 1, wherein the systematic non-linearity characteristic is non-linear capacitance.

14. The system of claim 13, wherein the reference variable is a voltage across the non-linear capacitance.

15. The system of claim 1, wherein the digital to analog converter is a current mode converter.

16. The system of claim 1, wherein the systematic non-linearity characteristic is temperature.

17. The system of claim 1, further comprises a non-systematic error correction network to calibrate for non-systematic errors in the digital to analog converter.

18. The system of claim 17, wherein the non-systematic errors are caused by manufacturing process of the digital to analog converter.

19. A method to correct for non-linearity errors in a digital to analog conversion of a digital input signal to an analog output signal, comprising:
   sample the digital input signal;
   generate an anti-distortion signal based on the sampled signal, wherein the anti-distortion signal includes a correction transform function based on a systematic error present in the conversion;
   scale the anti-distortion signal according to a reference variable, wherein the reference variable is related to the systematic error;
   apply anti-distortion signal to the conversion; and
   generate the analog output signal.

20. The method of claim 19, wherein generating an anti-distortion signal includes using a LUT of systematic non-linearity properties.

21. The method of claim 19, wherein scaling the anti-distortion signal includes amplifying the anti-distortion signal.

22. The method of claim 19, wherein scaling the anti-distortion signal includes attenuating the anti-distortion signal.

23. The method of claim 19, wherein the anti-distortion signal is a bipolar polynomial transform function.

24. The method of claim 19, wherein the anti-distortion signal is an unipolar transform function.

25. The method of claim 19, further comprises converting the anti-distortion signal to an analog anti-distortion signal.

26. The method of claim 19, wherein the systematic error is non-linear resistance.

27. The method of claim 19, wherein the systematic error is non-linear capacitance.

28. The method of claim 19, wherein the systematic error is related to temperature.

29. The method of claim 19, further comprises calibrating the conversion for non-systematic errors.

30. The method of claim 19, wherein the non-systematic errors are caused by manufacturing process errors.

\* \* \* \* \*